United States Patent
Krech, Jr. et al.

(10) Patent No.: US 7,181,660 B2
(45) Date of Patent: Feb. 20, 2007

(54) RECONSTRUCTION OF NON-DETERMINISTIC ALGORITHMIC TESTER STIMULUS USED AS INPUT TO A DEVICE UNDER TEST

(75) Inventors: Alan S. Krech, Jr., Fort Collins, CO (US); Stephen Dennis Jordan, Fort Collins, CO (US); Hsiu-Huan Shen, Saratoga, CA (US)

(73) Assignee: Verigy Pte. Ltd., Singapore (SG)

( * ) Notice: Subject to any disclaimer, the term of this patent is extended or adjusted under 35 U.S.C. 154(b) by 571 days.

(21) Appl. No.: 10/206,264

(22) Filed: Jul. 26, 2002

(65) Prior Publication Data
US 2004/0019839 A1  Jan. 29, 2004

(51) Int. Cl.
*G01R 31/28* (2006.01)
(52) U.S. Cl. .................... 714/724; 714/738
(58) Field of Classification Search ............ 714/724, 714/738, 741, 742; 365/200, 201
See application file for complete search history.

(56) References Cited

U.S. PATENT DOCUMENTS

| | | | |
|---|---|---|---|
| 5,680,518 A * | 10/1997 | Hangartner | 706/52 |
| 5,748,642 A * | 5/1998 | Lesmeister | 714/724 |
| 6,282,134 B1 * | 8/2001 | Kumar | 365/201 |
| 6,681,351 B1 * | 1/2004 | Kittross et al. | 714/724 |
| 2004/0006447 A1 * | 1/2004 | Gorin | 702/181 |

OTHER PUBLICATIONS

Agilent 93000 SOC Series User Training Part 1, Revision 2.2, available from Agilent Technologies, Inc. as Part No. 5968-5522E, 2000, pp. 274-278.

* cited by examiner

*Primary Examiner*—Albert Decady
*Assistant Examiner*—John J. Tabone, Jr.

(57) ABSTRACT

Input to a device under test (DUT) is reconstructed. For each trigger cycle of a tester in which data is to be input to the DUT stimulus, data is prepared to be placed as stimulus on pins of the DUT. Response information obtained from the DUT during a previous trigger cycle is used to construct formatting information used to adjust a value of the stimulus data. Reconstruction information sufficient to reconstruct the stimulus data is stored. The reconstruction information includes the formatting information. The reconstruction information is used to reconstruct the stimulus data placed on the pins of the device under test.

20 Claims, 8 Drawing Sheets

RECONSTRUCTION OF NON-DETERMINISTIC ALGORITHMIC TESTER STIMULUS USED AS INPUT TO A DEVICE UNDER TEST

BACKGROUND

The present invention pertains to circuit testing and pertains particularly to the reconstruction of non-deterministic algorithmic tester stimulus used as input to a device under test or expected response for comparison with output from a device under test.

After manufacture, circuits are extensively tested to assure proper performance. For example, memory testers are used to test random access memories used in computers and other devices. Testing is typically performed by applying signals to and reading signals from pins of a device under test (DUT). Typically, the pins of a DUT function as address pins, data pins and control pins. The inputs and outputs of a DUT, including address pins, data pins and control pins are referred to herein as input/output pins or simply as pins. Some input/output pins are used just to input signals to the DUT. Other input/output pins are used just to output signals from the DUT. Other input/output pins are bi-directional used both to input signals to the DUT and to output signals from the DUT.

Some test systems include programs that display waveforms for signals on the input/output pins of a DUT. Various mechanisms are used to capture signals for display.

For example, some test systems can process instructions in the test pattern and read the hardware state information to determine the waveform of signals to be placed on the inputs of the DUT. Similarly, some test systems can process instructions in the test pattern and read the hardware state information to determine the waveform of signals the test system expects to detect at the outputs of the DUT.

Some test systems make measurements at the inputs and/or outputs of a DUT in order to measure actual signals. This allows actual display of input and output signals for a DUT during a test. However, hardware constraints of test systems often limit the resolution at which data is displayed.

For example, a test system may simultaneously test multiple DUTs at one time. Simultaneous testing of up to 36 DUTs is typical. Each DUT has a multitude of input/output pins. DUTs with 64 pins or more are common. It would be time and/or cost prohibitive to use a voltage meter or oscilloscope to determine the exact voltage of every pin of every DUT being tested by a test system. For this reason, test systems typically include a compare circuit for each pin of each DUT being tested to compare the voltage at a pin with a test voltage. A voltage comparison typically can be performed at every pin once per test cycle. For increased voltage resolution of signals, several test cycles can be run and the voltage comparisons can be performed with different test voltages. For increased timing resolution of signals, several test cycles can be run and the voltage comparisons can be performed with different amounts of delay from the beginning of the test cycle.

SUMMARY OF THE INVENTION

In accordance with a preferred embodiment of the present invention, input to a device under test (DUT) is reconstructed. For each trigger cycle of a tester in which data is to be input to the DUT stimulus, data is prepared to be placed as stimulus on pins of the DUT. Response information obtained from the DUT during a previous trigger cycle is used to construct formatting information used to adjust a value of the stimulus data. Reconstruction information sufficient to reconstruct the stimulus data is stored. The reconstruction information includes the formatting information. The reconstruction information is used to reconstruct the stimulus data placed on the pins of the device under test.

DESCRIPTION OF THE PREFERRED EMBODIMENT

Figure 1:
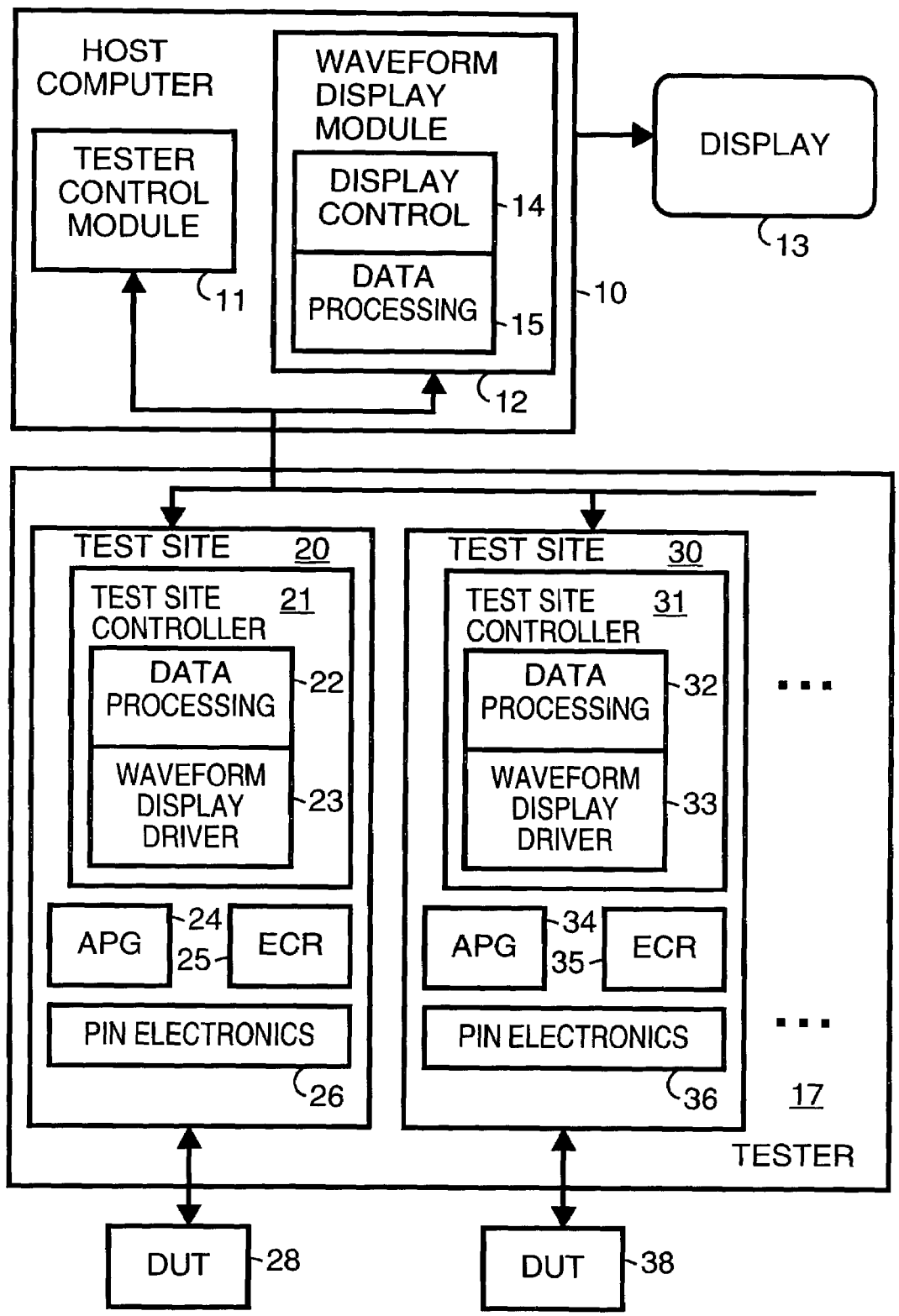
FIG. 1 is a simplified block diagram of a test system in accordance with a preferred embodiment of the present invention.

FIG. 1 is a simplified block diagram that shows a test system. A device under test (DUT) 28, and a DUT 38 represent the devices being tested. In a typical test system, 36 DUTs can be tested at one time.

Each DUT interfaces with a test site within a tester 17. For example,

FIG. 1 shows DUT 28 interacting with a test site 20 and DUT 38 interacting with a test site 30.

Test site 20 includes a test site controller 21. Test site controller 21 includes a data processing block 22 and a waveform display driver 23, implemented in software. An algorithmic pattern generator (APG) 24 generates test data used to test DUT 28. Error capture RAM (ECR) includes random access memory (RAM) used to capture error information from DUT 28. Pin electronics 26 includes analog circuitry used to write signals to and read signals from DUT 28.

Depending on the data capture mechanism being used, waveform display driver 23 obtains data from monitoring pins of DUT 28 or from the test instruction memory in APG 24 and the state of test site 20 hardware. Data processing block 22 controls waveform display driver 23 instructing waveform display driver 23 what data to obtain and determining when data is valid. Data processing block 22 also arranges data in a format that waveform display module 12 expects before forwarding the data to waveform display module 12.

Test site 30 includes a test site controller 31. Test site controller 31 includes a data processing block 32 and a waveform display driver 33, implemented in software. An algorithmic pattern generator (APG) 34 generates test data used to test DUT 38. Error capture RAM (ECR) is used 35 is used to capture error information from DUT 38. Pin electronics 36 includes analog circuitry used to write signals to and read signals from DUT 38.

Depending on the data capture mechanism being used, waveform display driver 33 obtains data from monitoring pins of DUT 38 or from the test instruction memory in APG 34 and the state of test site 30 hardware. Data processing block 32 controls waveform display driver 33 instructing waveform display driver 33 what data to obtain and determining when data is valid. Data processing block 32 also arranges data in a format that waveform display module 12 expects before forwarding the data to waveform display module 12.

A host computer 10 includes a tester control module 11 and a waveform display module 12. Tester control module 11 is, for example, implemented as a software module that oversees tests performed by tester 17. Waveform display module 12 includes a data processing block 15 used to process data from tester 17 in preparation to passing the data to a display control block 14. In a preferred embodiment of the present invention, data processing block 15 and display control block 14 are implemented as software modules.

Display control block 14 is used to control display of waveform data on a display 13. The test system also includes a driver module 23 used to provide control of the test site controllers. Waveform display module 12 communicates with a test site to obtain data for display. The data can include test patterns to be placed on input/output pins of a DUT by the test site controller during testing, test results expected to be placed on the input/output pins by a DUT during testing, and/or actual signals measured on the input/output pins of a device under test. Waveform display module 12 displays waveforms on display 13.

Figure 2:
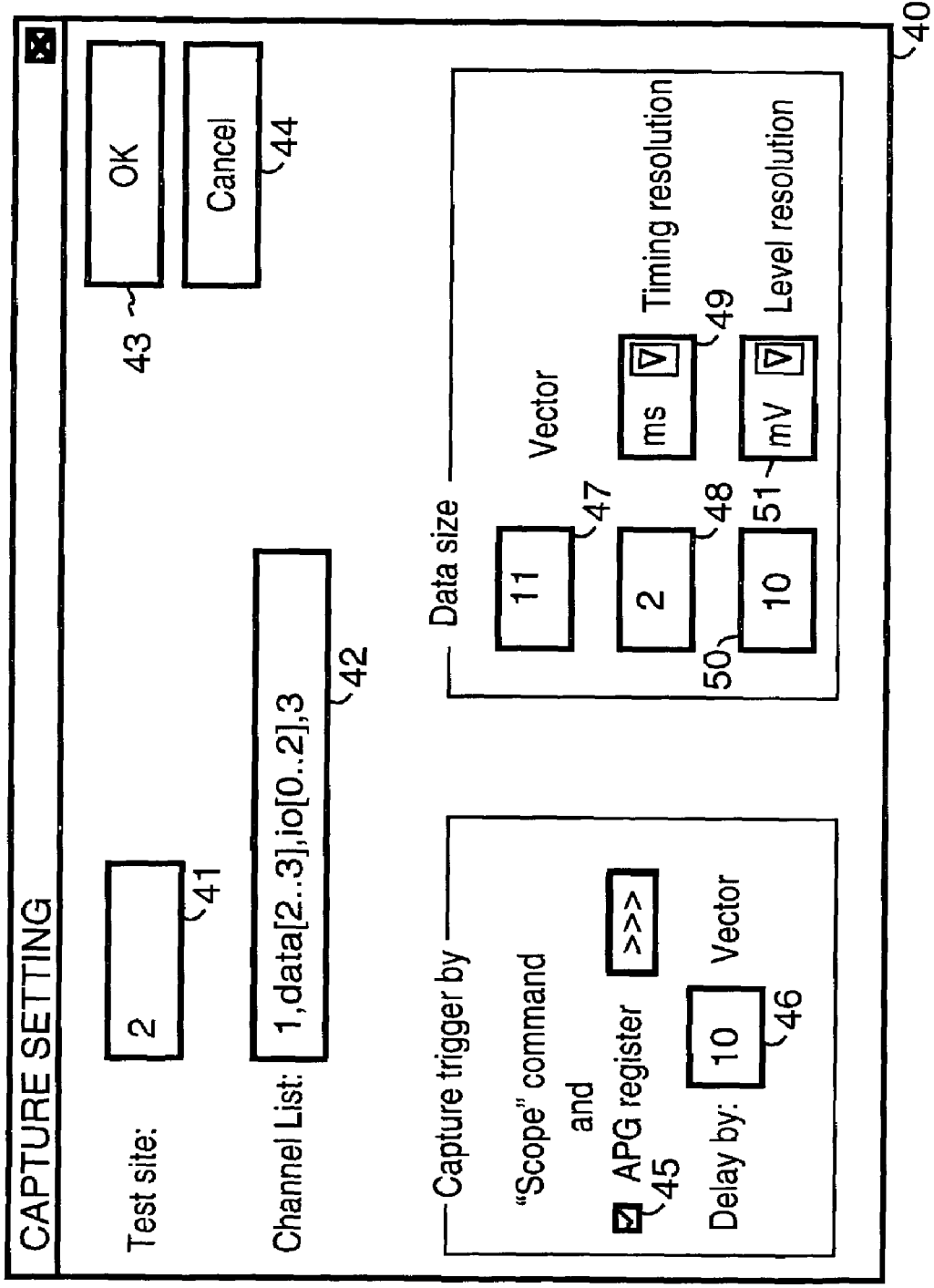
FIG. 2 shows a graphics user interface display of a window used for entering settings for capturing signals in accordance with a preferred embodiment of the present invention.

FIG. 2 shows a graphics user interface display of a window 40 used for entering settings for capturing signals for a DUT. In a box 41 a user selects a test site from which to obtain the data. In a box 42, the user indicates which channels (pins or pin groups), for which waveforms will be drawn.

A box 45 can be checked when the capture trigger is conditional upon the algorithmic pattern generator (APG) state. In a box 46, a user indicates how many test vectors are ignored before data is captured. In a box 47, the user indicates for how many test vectors data signals will be captured.

In a box 48, the user can specify a value for a timing resolution. In a box 49, the user can select units for the value placed in box 48. For example, in order to increase timing resolution, the test needs to be repeated and values on input/output pins of the DUT sampled at different locations within each test cycle (i.e., each input cycle and each output cycle). Thus, the higher the timing resolution, the longer it takes to obtain test results. Adjustment of timing resolution is necessary only in scope mode and logic analyzer mode, as defined below.

In a box 50, the user can specify a value for voltage level resolution. In a box 51, the user can select units for the value placed in box 50. For example, in order to increase voltage level resolution, the test needs to be repeated and values on input/output pins of the DUT sampled against different compare voltages. Thus, the higher the voltage level resolution, the longer it takes to obtain test results. Adjustment of voltage resolution is necessary only in scope mode, as defined below.

An OK button 43 is used to confirm the capture settings indicated by the user using window 40. A cancel button 44 is used to cancel the capture settings indicated by the user using window 40.

Figure 3:
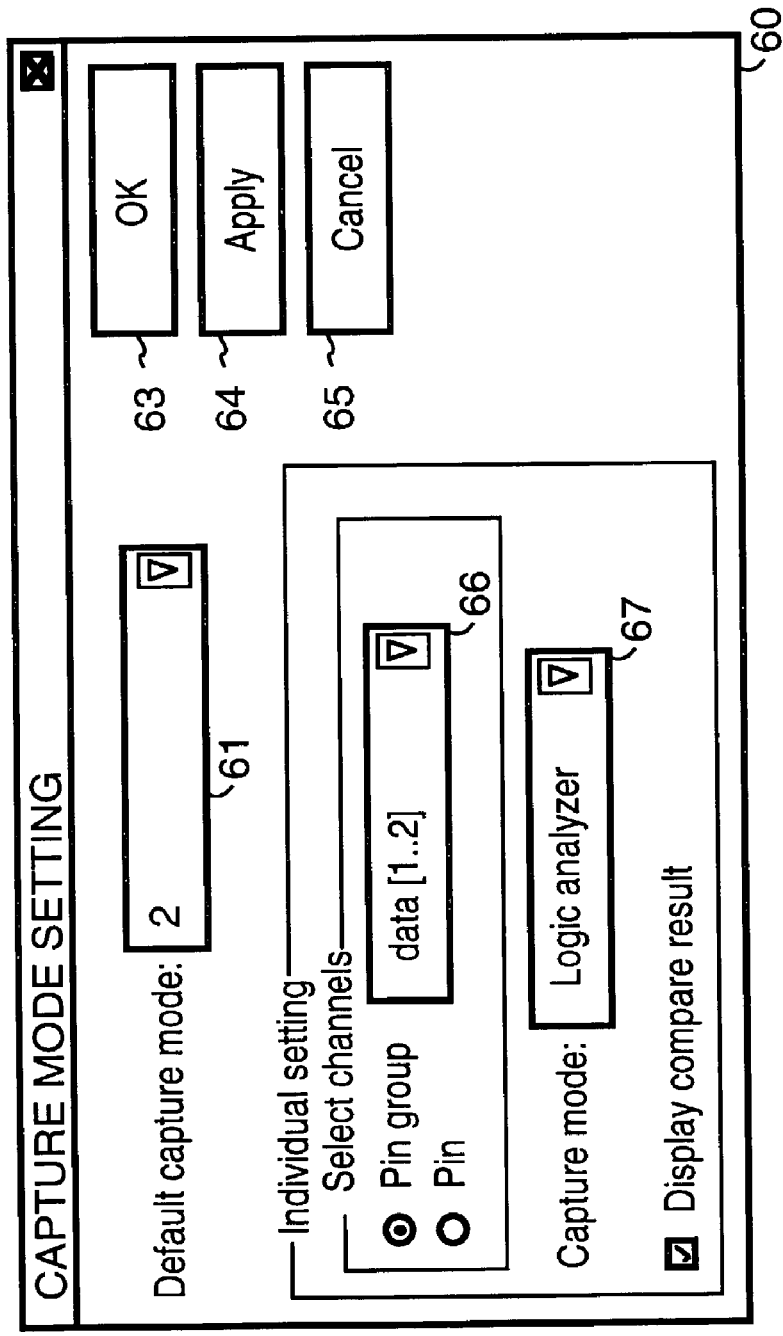
FIG. 3 shows a graphics user interface display of a window used for selecting a mode for capturing signals in accordance with a preferred embodiment of the present invention.

FIG. 3 shows a graphics user interface display of a window 60 used for indicating mode settings for capturing signals for a DUT. In a box 61, a user can specify a default mode for those channels that are not specifically set by a user. In a box 67, the user selects a mode. In a box 66 the user indicates which channels (pins or pin groups), for which the settings of box 67 apply. A user can use box 66 and box 67 in window 60 multiple times to allow for different settings to be assigned to different channels of pins and pin groups.

An OK button 63 is used to confirm the capture settings indicated by the user using window 60. An apply button 64 is used to apply the capture settings indicated by the user using window 60. A cancel button 65 is used to cancel the capture settings indicated by the user using window 60.

Figure 4:
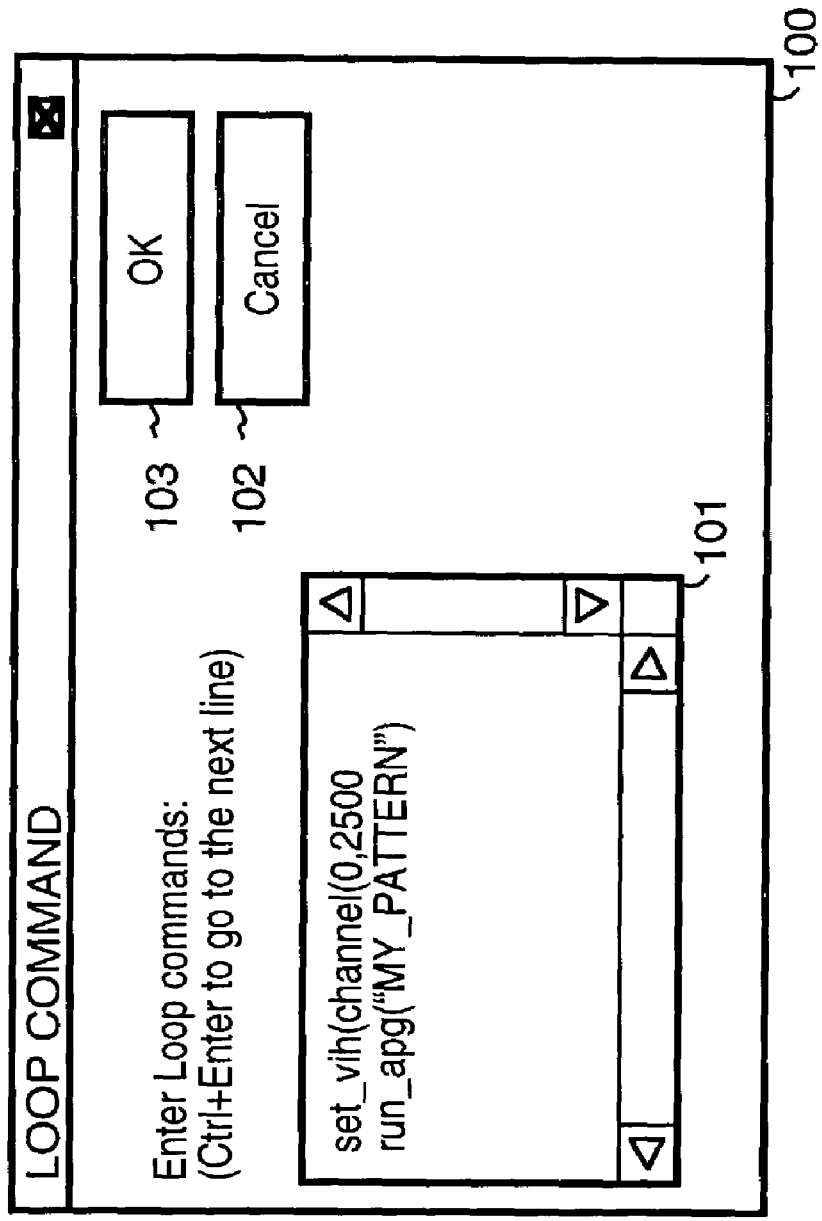
FIG. 4 shows a graphics user interface display of a window used for entering loop commands in accordance with a preferred embodiment of the present invention.

FIG. 4 shows a window 100 used to enter loop commands. The loop commands are test patterns and tester set-up that apply stimulus to and comparison values from a device under test. The test patterns are algorithmic in nature. For example, loop commands that are test patterns that increment addresses can be expressed in one or a few lines of code. This is in contrast to test patterns that are expressed merely as a long sequence of numbers.

Table 1 below sets out an example of a simple algorithmic test pattern expressed as loop commands:

TABLE 1

LOOP: entry
X++, jump (!xmax) LOOP, write_dut_with 0x0000;

The algorithmic test pattern set out in Table 1 successively increments an address value "X", writes the DUT at the address specified with the value of 0, and loops back to the entry point, "LOOP". The action occurs until a predefined value of "xmax" is reached.

More complex algorithmic test patterns may rely on response from the DUT. For example, a more complex algorithmic test pattern is set out in Table 2 below:

TABLE 2

LOOP: entry
  x++, compare_dut_with 0x0000, jump (!xmax && !ferr)
    LOOP;
  if (ferr) x=0xfffe, write_dut_info=0xdead; quit;
  else x=0xfffe, write_dut_info=0xbeef;
LOOP2: entry
  y++, compare ...
  ...

The algorithmic test pattern set out in Table 2 also successively increments an X address value. But this time the algorithmic test pattern compares the DUT response with a value of 0x0000. The loop continues until all X addresses have been tested or until an error occurs. When the looping portion is completed, a test to find out if the loop exited because of a functional error (ferr) is performed and depending upon that result, different stimulus is provided to the DUT. If an error occurred, stimulus of address X=0xfffe is provided as well as data stimulus of 0xdead. The algorithmic test pattern is then quit. If instead the loop exited because the X address range was completed, address stimulus of 0xfffe is provided along with a data stimulus of 0xbeef. Then the algorithmic test pattern moves on to a second loop for further testing. Thus, in a slightly more complex algorithmic test pattern, the DUT stimulus is different depending upon DUT response.

In box 101 of window 100, loop commands are entered. An OK button 103 is used to confirm the loop commands entered by the user. A cancel button 102 is used to cancel the loop commands entered by the user.

After the user has set up a capture using window 40, window 60 and window 100, the user can start a capture by issuing a capture command. This is done, for example, by selecting a start capture button, or selecting a start capture command on a pull-down menu.

In one embodiment of the present invention there are six modes. In each mode data is captured in different ways, as described below.

A reconstruction mode is used to obtain input information only. In the reconstruction mode, waveform display module 12 obtains and displays voltage values. The voltage values are produced by execution of test pattern files by the waveform display driver within the selected test site. The test pattern files, generated by APG 24, are used to generate test patterns to be placed on the pins of the DUT by the test site.

An expected data mode is used to obtain output information only. In the expected data mode, waveform display module 12 obtains and displays voltage values by obtaining expected results from execution of the test pattern files. That is, the waveform display driver within the test site controller calculates what the DUT should, if operating properly, provide to output pins in response to the test patterns to be placed on the pins of the DUT by the test site.

A high speed mode is used to obtain output information only. In the high speed mode, the APG executes a test pattern file and causes the pin electronics to drive input and compare output on the pins of the DUT.

The pin electronics for each test site is run on a variable speed clock that is driven by the APG for the test site. Each cycle of the clock driven by the APG is a test cycle. For each test cycle, a new test instruction will execute. For example, if the test cycle is an input cycle, the pin electronics will drive input data on data pins and drive a write enable pin of the DUT during the input cycle. Alternatively, the pin electronics will drive input data on data pins in one input cycle and drive a write enable pin of the DUT during another input cycle. For example, if the test cycle is an output cycle, the pin electronics will drive an output enable of the DUT and the test site will compare output data received from the DUT with expected data within a single output cycle. Alternatively, the pin electronics will drive an output enable of the DUT on one output cycle and the test site will compare output data received from the DUT with expected data in another output cycle.

In high speed mode, the entire test is run once. For each output cycle, a single comparison is made for each expected output datum to determine whether the actual value on the pin of the DUT is a logic 1 (voltage output high (VOH)), a logic 0 (voltage output low (VOL)) or a high impedance (Hi-Z) as expected in the test pattern.

A logic analyzer mode is used to capture both input and output signals. In logic analyzer mode the waveforms are constructed by running the test multiple times, depending upon the timing resolution the user sets. Each time the test is run a single comparison is made for every test cycle. For each output cycle, a comparison is made to determine whether the output datum is a logic 1 (voltage output high (VOH)) or a logic 0 (voltage output low (VOL)). For each input cycle, a comparison is made on an input pin. For DUTs where the inputs are binary (either logic 1 or logic 0), a single comparison is sufficient to resolve the input. For DUTS where the input may have additional voltage levels (e.g., potential input voltage values are VHH, VIH, VIL and HIZ), it is necessary to run the test multiple times (since there is no capability to make multiple comparisons per input test cycle) in order to obtain proper resolution of input voltage values.

The number of times the test must be run depends on the timing resolution required. For example, if it is desired to have timing resolution equal to ⅕ the duration of a test cycle, it is necessary to run the test five times at different offsets from the beginning of each test cycle. This allows for binary voltage resolution of the inputs and outputs to the DUT.

Logic analyzer mode provides for "medium" speed data capture. More information is provided about the waveform transition timing, but there is minimal voltage resolution.

A scope mode is used to capture both input and output signals. The number of times each test must be run depends upon the timing resolution the user sets and the voltage resolution the user sets. Scope mode allows construction of waveforms with high timing resolution and high voltage resolution. Because of the high resolution, capture speed is slow.

For example, if it is desired to have timing resolution equal to ⅕ the duration of a test cycle and voltage resolution based on comparisons to three different voltages, it is necessary to run the test fifteen times. This allows comparisons for five different offsets at three different voltage levels for each test cycle.

An input/output (I/O) combined mode is a combination of the reconstruction mode for inputs to the DUT and the high speed mode for the outputs of the DUT. For pins used just for input to a DUT, waveform display module 12 obtains and displays voltage values by executing test pattern files. For pins used just for output from a DUT, waveform display module 12 constructs a waveform by single shot capture (as in the high speed mode). For the single shot capture, only one comparison is made on the signal for each output test cycle. Thus the time resolution and the voltage value resolution are only sufficient to determine whether a logic 0, a logic 1 or a high impedance (as expected in the test pattern) exists during a single output cycle. Since the timing resolution and the voltage value resolution are minimal, this allows for high speed capture of information. For pins used both for input and output, how a waveform is constructed is based on when data is being input to the DUT and when data is being output from the DUT. For portions of the waveform corresponding to input to the DUT, the waveform is constructed by executing test pattern files. For portions of the waveform corresponding to output from the DUT, the waveform is constructed by single shot capture.

Figure 5:
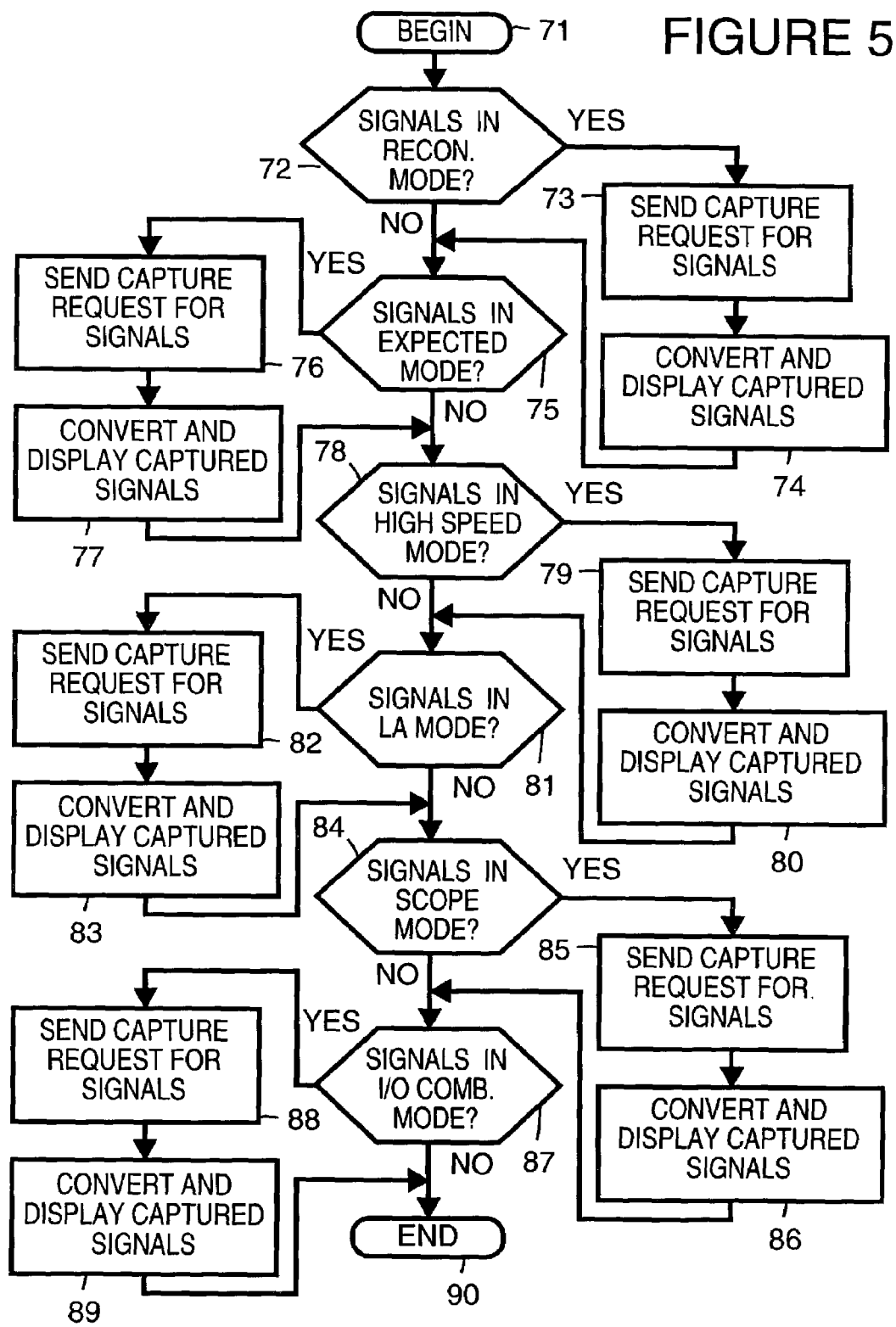
FIG. 5 is a simplified flowchart that illustrates operation of a waveform display module when displaying waveforms in accordance with a preferred embodiment of the present invention.

FIG. 5 is a simplified flowchart that illustrates operation of waveform display module 12 when a user has assigned different data gathering mechanisms to pins and/or groups of pins. The waveforms for all the pins are displayed together in a single image. This allows waveform display module 12 to respond to a single setup by gathering data for all pins and progressively displaying the waveforms in the different modes selected by the user. Once waveform display module 12 completes the display process, all the waveforms requested by the user are simultaneously displayed on display 13.

In a block 71, waveform display module 12 begins a process to display waveforms requested by a user. In a block 72, waveform display module 12 checks to see if any of the signals are to be displayed in the reconstruction (RECON) mode. If so, in a block 73, waveform display module 12 sends a capture request to the selected test site for the signals to be displayed in RECON mode. Once the data on the input signals are received back, in a block 74, waveform display module 12 converts the units of the data to display coordinates and displays waveforms for the input signals on display 13. When returning data to waveform display module 12, the test site marks the output signals as unknown.

In a block 75, waveform display module 12 checks to see if any of the signals are to be displayed in the expected data mode. If so, in a block 76, waveform display module 12 sends a capture request to the selected test site for the signals to be displayed in expected data mode. Once the data on the output signals are received back, in a block 77, waveform display module 12 converts the units of the data to display coordinates and displays waveforms for the output signals on display 13. When returning data to waveform display module 12, the test site marks the input signals as invalid. The display is cumulative so that the waveforms are displayed in addition to the waveforms that were displayed at block 74. When displaying data, waveform display module will use insertion of waveforms as necessary in order to keep the waveforms in the order requested by user.

In a block 78, waveform display module 12 checks to see if any of the signals are to be displayed in the high speed mode. If so, in a block 79, waveform display module 12 sends a capture request to the selected test site for the output signals to be displayed in high speed mode. Once the data on the output signals are received back, in a block 80, waveform display module 12 converts the units of the data to display coordinates and displays waveforms for the output signals on display 13. When returning data to waveform display module 12, the test site marks the input signals as invalid. When displaying data, waveform display module will use insertion of waveforms as necessary in order to keep the waveforms in the order requested by user.

In a block 81, waveform display module 12 checks to see if any of the signals are to be displayed in the logic analyzer (LA) mode. If so, in a block 82, waveform display module 12 sends a capture request to the selected test site controller for the signals to be displayed in the logic analyzer mode. The capture request includes the timing resolution indicated by the user. Once the data on the signals are received back, in a block 83, waveform display module 12 converts the units of the data to display coordinates and displays waveforms for the signals on display 13. When displaying data, waveform display module will use insertion of waveforms as necessary in order to keep the waveforms in the order requested by user.

In a block 84, waveform display module 12 checks to see if any of the signals are to be displayed in the scope mode. If so, in a block 85, waveform display module 12 sends a capture request to the selected test site controller for the signals to be displayed in the scope mode. The capture request includes the timing resolution and the voltage resolution indicated by the user. Once the data on the signals are received back, in a block 86, waveform display module 12 converts the units of the data to display coordinates and displays waveforms for the signals on display 13.

In a block 87, waveform display module 12 checks to see if any of the signals are to be displayed in the I/O combined mode. If so, in a block 88, waveform display module 12 sends a capture request to the selected test site controller for the signals to be displayed in I/O combined mode. Once the data on the signals are received back, in a block 89, waveform display module 12 converts the units of the data to display coordinates and displays waveforms for the signals on display 13. In I/O mode, the data processing module of the test site controller for the selected test site indicates which part of the signals are for input and which part are for output. This allows waveform display module 12 to indicate to a user which part of the waveform represents input to the DUT and which part of the waveform represents output from the DUT.

In a block 90, waveform display module 12 has completed display of the waveforms.

Figure 6:
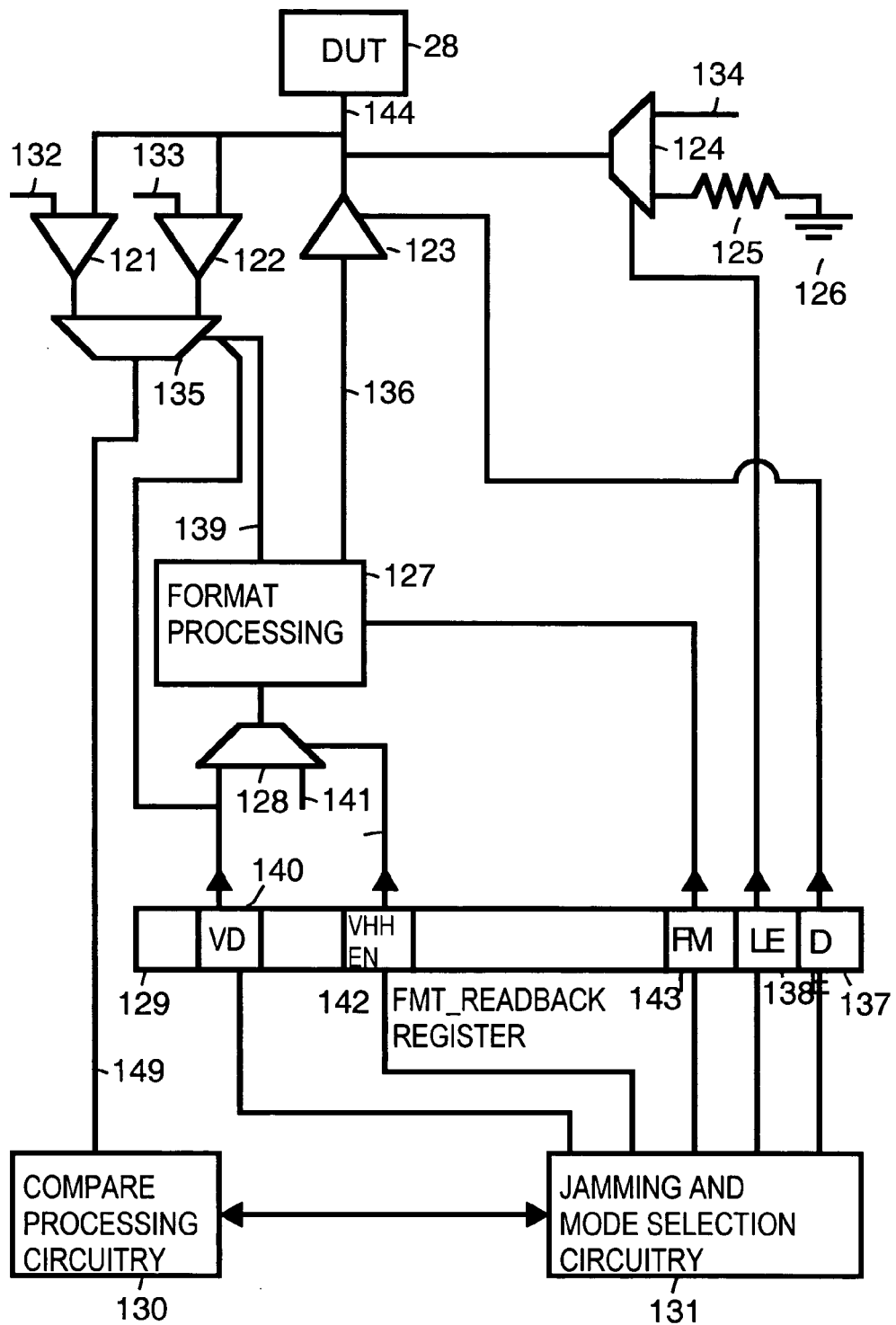
FIG. 6 is a simplified block diagram of pin electronics for a pin of a device-under-test (DUT) in accordance with a preferred embodiment of the present invention.

FIG. 6 shows a simplified block diagram of a portion of pin electronics 26 used to interact with a single pin 144 of DUT 28. The interaction includes both providing stimulus input to and reading response output from pin 144 of DUT 28.

Jamming and mode selection circuitry 131 is used for "jamming" and mode selection. Jamming is a hardware feature that allows for modification of DUT stimulus data. Jamming circuitry performs on-the-fly formatting of stimulus data to modify the DUT stimulus described in the test pattern before forwarding the stimulus on the DUT. For example, flash memory devices require multiple programming cycles to learn a program. Different bits in a word (programmed in parallel) may each take a different number of programming cycles. It can be damaging to a device to over-program a given bit too many times. Over-programming means to continue programming a bit after the bit has been learned. In order to allow all bits in a word to be programmed before moving onto a next address, low level jamming circuitry detects when each bit is programmed (response from the DUT) and changes the stimulus to the DUT for just that bit to be a no-operation (NOP) rather than a program instruction.

The non-deterministic pattern execution and low-level stimulus/response jamming make it impossible to predict what DUT stimulus will look like using simulation. However, knowing the actual stimulus to be placed on DUT pins is helpful for test program developers to understand a failing device and to debug test programs.

A format read-back (FMT_READBACK) register 129 contains information about the tester channel for pin 144 of DUT 28. Format read-back register 129 remembers the last operation performed in the tester channel for pin 144. In alternative embodiments, format read-back register 129 can be implemented as multiple registers or as a large enough single register to remember multiple operations. Storage of multiple operations reduces the frequency at which the format read-back register(s) is (are) read when obtaining waveforms in reconstruction mode and/or expected data mode.

Format read-back register 129 includes a drive enable (DE) bit 137 active for the DUT input cycle, but not for a compare cycle. Format read-back register 129 also includes a load enable (LE) bit 138 used to turn on the load. Format read-back register 129 also includes a voltage (VD) bit 140 used to drive or compare a logic zero (VOL) or a logic one (VOH). A high voltage enable (VHH_EN) bit 142 enables the VHH voltage (instead of a logic zero or a logic one). A two-bit format (FMT) value 143 provides formatting information. Format read-back register 129 also provides additional bits of information.

Format processing 127, in response to format value 143, formats the drive value placed on line 136. Format processing 127 also produces a selection bit placed on a line 139, which along with VD bit 140 is used by a compare select 135 to select a comparison value of a logic 0 (VOL), a logic 1 (VOH), or a "between" (z) to be performed. Compare select 135 determines whether to place a pass or a fail value on a line 149, read by compare processing circuitry 130.

A compare circuit 121 compares a logic 0 (VOL) on a line 132 with a value on pin 144 of DUT 28. A compare circuit 122 compares a logic 1 (VOH) on a line 133 with a value on pin 144 of DUT 28. A multiplexer 124 is used to select between a load consisting of a resistance 125 connected to a ground 126, and an unloaded line 134. A drive enable circuit 123, in response to drive enable bit 137, determines whether a drive value on line 136 is forwarded to pin 144 of DUT 28. Additional buffering/amplifying circuitry can be used for buffering voltage values placed on pin 144. The drive value on line 136 is, for example, a logic 0 (VOL), a logic one (VOH) or a programming voltage (VHH).

A multiplexer 128, in response to VHH enable bit 142, selects either voltage drive bit 140 or the programming voltage (VHH) placed on line 141 to forward to format processing logic 127.

Figure 7:
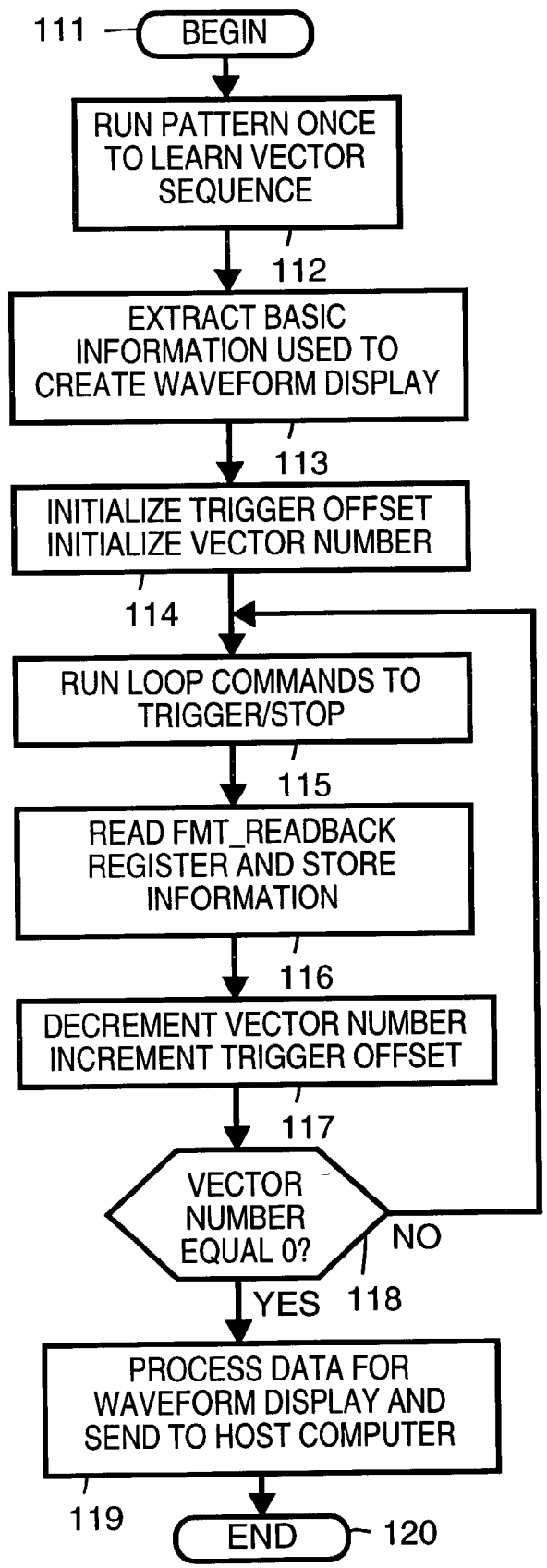
FIG. 7 is a simplified flowchart that illustrates operation of a test site when obtaining waveforms in a reconstruction mode or in an expected data mode in accordance with a preferred embodiment of the present invention.

FIG. 7 is a simplified flowchart illustrating operation of test site 20 in response to a request for obtaining, in reconstruction mode or in expected data mode, waveforms for signals.

In a block 111, the process begins. In a block 112, test site controller 21 runs the specified algorithmic test pattern to learn the vector sequence.

In a block 113, test site controller 21 extracts the basic information to create a waveform display. The basic information includes for example, the cycle length, edge timings and line numbers, etc., for the algorithmic test pattern.

In a block 114, test site 20 initializes a trigger offset to a value requested by the user. Test site 20 also initializes the vector number to a value requested by the user.

In a block 115, test site 20 runs the loop commands to the trigger point and stops. In a block 116, test site controller 21 reads the format read-back (FMT_READBACK) register and stores the information. In a block 117, the vector number is decremented and the trigger offset is incremented.

In a block 118, a check is made to see whether the vector number is equal to zero. If not, in block 115, test site 20 runs the loop commands to the trigger point and stops. If in block 118, the check indicates the vector number is equal to zero, in a step 119, test site controller 21 processes data for waveform display and sends the processed data to host computer 10.

Figure 8:
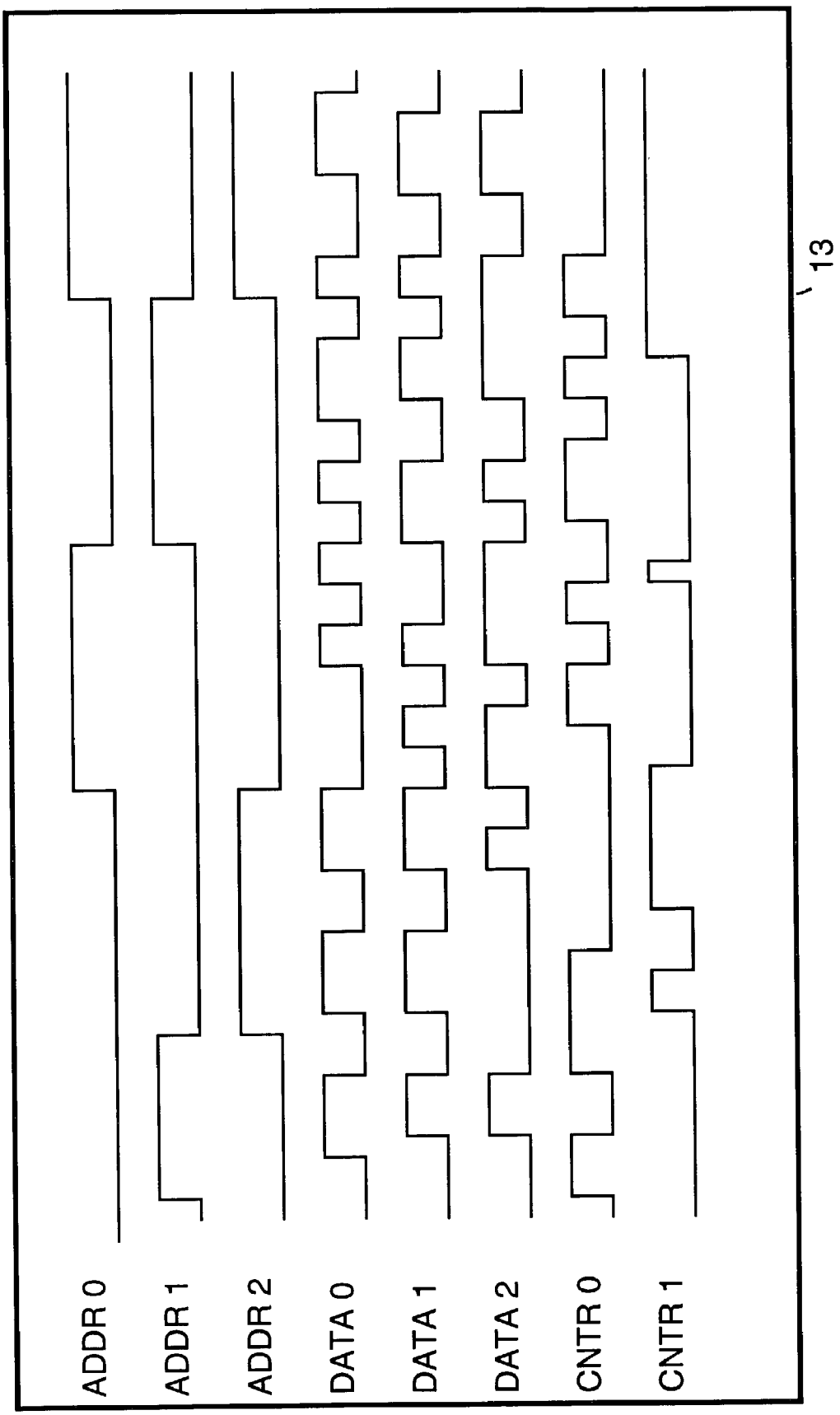
FIG. 8 shows a simplified display of waveforms captured in reconstruction and an expected data mode in accordance with a preferred embodiment of the present invention.

In FIG. 8 gives a simplified example of captured waveforms displayed in simplified form by waveform display module 12 on display 13. The signals ADDR 0, ADDR 1 and ADDR 2, signals from pins used just for input to a DUT, are captured in a reconstruction mode. The signals DATA 0, DATA 1, DATA 2 are signals from bi-directional pins used both for input to and output from a DUT. Bi-directional pins can have some cycles be DUT stimulus and others DUT response. For bi-directional pins, reconstruction mode provides data for only the DUT stimulus cycles. Expected data mode provides the expected data waveform data. CNTR 0 and CNTR 1, signals from pins used just for output from a DUT, are captured in an expected data mode.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for reconstructing input to a device under test (DUT), the method comprising the following steps:
    (a) for each trigger cycle of a tester in which data is to be input to the DUT, performing the following substeps:
        (a.1) preparing stimulus data that is placed as stimulus on pins of the DUT, including the following substep:
            using response information obtained from the DUT during a previous trigger cycle to construct formatting information used to adjust a value of the stimulus data, and
        (a.2) storing reconstruction information sufficient to reconstruct the stimulus data, the reconstruction information including the formatting information; and,
    (b) using the reconstruction information to reconstruct the stimulus data previously placed on the pins of the device under test.

2. A method as in claim 1 wherein in substep (a.2) the reconstruction information for each DUT pin is stored in a register which is read once per trigger cycle.

3. A method as in claim 1 additionally comprising the following step:
    (c) displaying a waveform of the stimulus data as reconstructed in step (b).

4. A method as in claim 1 wherein substep (a.2) includes storing mode selection information as part of the reconstruction information.

5. A method as in claim 1 wherein in step (a.2), the reconstruction information is stored in a separate register for each pin of the DUT.

6. A method for determining expected output from a device under test (DUT), the method comprising the following steps:
    (a) for each trigger cycle of a tester in which data is to be output from the DUT, performing the following substeps:
        (a.1) preparing channel information that is sufficient to determine expected output data from the DUT, including the following substep:
            using response information obtained from the DUT during a previous trigger cycle to construct formatting information used to adjust a value of the channel information, and
        (a.2) storing the channel information, including the formatting information; and,
    (b) using the channel information to determine the expected output data from the DUT.

7. A method as in claim 6 wherein in substep (a.2) the channel information for each DUT pin is stored in a register which is read once per trigger cycle.

8. A method as in claim 6 additionally comprising the following step:
    (c) displaying a waveform of the expected output data as determined in step (b).

9. A method as in claim 6 wherein substep (a.2) includes storing mode selection information as part of the channel information.

10. A method as in claim 6 wherein in step (a.2) the channel information is stored in a separate register for each pin of the DUT.

11. A method used in testing a device under test (DUT), the method comprising the following steps:
   (a) for each trigger cycle of a tester, performing the following substeps:
      (a.1) preparing channel information, the channel information including at least one of the following:
         response information that is sufficient to determine any expected output data from the DUT,
         stimulus information that is sufficient to generate stimulus data to be placed as stimulus on pins of the DUT,
         wherein substep (a.1) includes the following substep:
            using response information obtained from the DUT during a previous trigger cycle to construct formatting information used to adjust a value of the channel information, and
      (a.2) storing the channel information, including the formatting information; and,
   (b) using the channel information to do at least one of the following:
      determine any expected output data from the DUT;
      reconstruct any stimulus data placed on the pins of the device under test.

12. A method as in claim 11 wherein in substep (a.2) for each pin of the DUT, the channel information is stored in a register which is read once per trigger cycle.

13. A method as in claim 11 wherein substep (a.2) includes storing mode selection information as part of the channel information.

14. A method as in claim 11 wherein in step (a.2) the channel information is stored in a separate register for each pin of the DUT.

15. A tester that tests a device under test (DUT), the tester comprising:
   circuitry that prepares channel information, the channel information including at least one of the following:
      response information that is sufficient to determine any expected output data from the DUT,
      stimulus information that is sufficient to generate stimulus data to be placed as stimulus on pins of the DUT; and,
   a storage device that stores the channel information, including the formatting information;
   wherein the channel information is used for at least one of the following:
      to determine any expected output data from the DUT,
      to reconstruct any stimulus data placed on the pins of the device under test; and,
   wherein response information obtained from the DUT during a previous trigger cycle is used to construct formatting information used to adjust a value of the channel information.

16. A tester as in claim 15 wherein the storage device includes a plurality of registers arranged so that for each pin of the DUT, the channel information is stored in one register from the plurality of registers, all the registers from the plurality of registers being read once per trigger cycle.

17. A tester as in claim 15 wherein the storage device additionally stores mode selection information as part of the channel information.

18. A tester that tests a device under test (DUT), the tester comprising:
   circuitry means for preparing channel information, the channel information including at least one of the following:
      response information that is sufficient to determine any expected output data from the DUT,
      stimulus information that is sufficient to generate stimulus data to be placed as stimulus on pins of the DUT; and,
   storage means for storing the channel information, including the formatting information;
   wherein the channel information is used to determine any expected output data from the DUT and to reconstruct any stimulus data placed on the pins of the device under test; and,
   wherein response information obtained from the DUT during a previous trigger cycle is used to construct formatting information used to adjust a value of the channel information.

19. A tester as in claim 18 wherein the storage means includes a plurality of registers arranged so that for each pin of the DUT, the channel information is stored in one register from the plurality of registers, all the registers from the plurality of registers being read once per trigger cycle.

20. A tester as in claim 18 wherein the storage means is additionally for storing mode selection information as part of the channel information.

* * * * *